United States Patent
Lin et al.

(10) Patent No.: US 8,026,615 B2
(45) Date of Patent: Sep. 27, 2011

(54) IC PACKAGE REDUCING WIRING LAYERS ON SUBSTRATE AND ITS CARRIER

(75) Inventors: Hung Tsun Lin, Tainan County (TW); Wu Chang Tu, Tainan County (TW); Cheng Ting Wu, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 12/825,811

(22) Filed: Jun. 29, 2010

(65) Prior Publication Data

US 2010/0264540 A1 Oct. 21, 2010

Related U.S. Application Data

(62) Division of application No. 11/806,023, filed on May 29, 2007, now Pat. No. 7,781,898.

(30) Foreign Application Priority Data

Jan. 24, 2007 (TW) .............................. 96102754 A

(51) Int. Cl.
  *H01L 23/49* (2006.01)
  *H05K 1/11* (2006.01)

(52) U.S. Cl. ............ 257/784; 257/E23.01; 257/E23.024; 257/786; 257/737; 257/738; 257/778; 257/698; 257/696; 257/691; 174/261

(58) Field of Classification Search .................. 257/784, 257/E23.01, 786, 737, 738, 778, 698, 696, 257/691, E23.024; 174/261
See application file for complete search history.

(56) References Cited

U.S. PATENT DOCUMENTS 6,291,898 B1  9/2001 Yeh et al.
6,429,515 B1  8/2002 Glenn
6,683,385 B2 * 1/2004 Tsai et al. ..................... 257/777
6,717,252 B2 * 4/2004 Saeki ............................ 257/686

(Continued)

FOREIGN PATENT DOCUMENTS

CN  1414821 A  4/2003

(Continued)

OTHER PUBLICATIONS

Office Action dated May 6, 2010 for 0992030589001 which is a corresponding Taiwanese application that cites US7105930, US6291898, US6429515, US6940182, and TWM267628.

(Continued)

Primary Examiner — Alexander O Williams
(74) Attorney, Agent, or Firm — WPAT, P.C.; Anthony King

(57) ABSTRACT

An IC package primarily includes a chip, a plurality of electrical connecting components, and a chip carrier including a substrate, a die-attaching layer, and at least one bonding wire. The substrate has a top surface and a bottom surface wherein the top surface includes a die-attaching area for being disposed with the die-attaching layer. The chip is attached to the die-attaching area by the die-attaching layer and is electrically connected to the substrate by the electrical connecting components. Both ends of the bonding wire are bonded respectively to two interconnecting fingers on the top surface of the substrate, and at least a portion of the bonding wire is encapsulated in the die-attaching layer such that some wirings or vias formed on a conventional substrate are not needed. Therefore, the substrate can have a simpler structure and fewer numbers of wiring layers; consequently, the substrate cost can be reduced.

13 Claims, 4 Drawing Sheets

U.S. PATENT DOCUMENTS

| | | |
|---|---|---|
| 6,940,182 B2 | 9/2005 | Hilton et al. |
| 7,105,930 B2 | 9/2006 | Lua et al. |
| 7,112,886 B2 | 9/2006 | Chang et al. |
| 7,551,329 B2 * | 6/2009 | Yoshikawa .................... 358/474 |
| 7,615,415 B2 * | 11/2009 | Kwon et al. .................. 438/125 |
| 2010/0270688 A1 * | 10/2010 | Su et al. ........................ 257/777 |

FOREIGN PATENT DOCUMENTS

| | | |
|---|---|---|
| TW | M267628 | 6/2005 |

OTHER PUBLICATIONS

Office Action dated Apr. 10, 2009 for 2007100969693 which is a corresponding Chinese application that cites CN1414821A and US7112886.

Office Action dated Jul. 31, 2009 for 2007100969693 which is a corresponding Chinese application that cites CN1414821A and US7112886.

* cited by examiner

IC PACKAGE REDUCING WIRING LAYERS ON SUBSTRATE AND ITS CARRIER

CROSS REFERENCE TO RELATED APPLICATIONS

This application is a Divisional application Ser. No. 11/806,023 filed May 29, 2007, now U.S. Pat. No. 7,781,898 and is based on and claims priority from R.O.C Patent Application No. 096102754 filed Jan. 24, 2007.

BACKGROUND OF THE INVENTION (A) Field of the Invention

The present invention relates to a chip package, particularly to a chip package having reduced wiring layers of a substrate.

(B) Description of the Related Art

In IC packages, multi-layer substrates are widely implemented for chip carriers and for electrical connections. However, the substrate cost is about 30% of the overall package cost, and the substrate cost increases as the wiring layers increase.

As shown in FIG. 1, a conventional IC package 100 primarily comprises a substrate 110, a die-attaching layer 120, a chip 130, and a plurality of electrical connecting components 140. The substrate 100 has a top surface 111, a bottom surface 112, and a plurality of inner fingers 113 disposed on the top surface 111. The back surface 132 of the chip 130 is attached to the top surface 111 of the substrate 110 by the die-attaching layer 120. A plurality of bonding pads 133 are disposed on the active surface 131 of the chip 130 wherein the bonding pads 133 of the chip 130 are electrically connected to the inner fingers 113 of the substrate 110 by the electrical connecting components 140 such as bonding wires. An encapsulant 150 is formed on the top surface 111 of the substrate 110 to encapsulate the chip 130 and the electrical connecting components 140. The IC package 100 further comprises a plurality of external terminals 160 disposed on the bottom surface 112 of the substrate 110 for external electrical connections. Before packaging, the substrate 100 must be fabricated to have all required wiring layers and vias; therefore, the substrate cost cannot be effectively reduced.

SUMMARY OF THE INVENTION

The main purpose of the present invention is to provide an IC package and chip carrier thereof, wherein a bonding wire is provided with both ends connected to the substrate to replace a portion of the wiring circuits and/or vias of a conventional substrate so that the total wiring layers of the substrate can be reduced or simplified to reduce the substrate cost.

The second purpose of the present invention is to provide an IC package including interconnecting bonding wire(s) that are connected to a substrate before encapsulation.

The third purpose of the present invention is to provide an IC package that can prevent the IC chip from contacting the bonding wire(s) with two ends bonded on the substrate.

According to the present invention, an IC package primarily comprises a substrate, a die-attaching layer, a chip, at least a bonding wire, and a plurality of electrical connecting components. The substrate has a top surface and a bottom surface, at least a first interconnecting finger and at least a second interconnecting finger. The at least one first interconnecting finger and the at least one second interconnecting finger are disposed on the top surface. Furthermore, a die-attaching area is defined on the top surface where the die-attaching layer is formed on the die-attaching area on the top surface of the substrate. The chip is disposed on the top surface of the substrate and attached to the die-attaching area by the die-attaching layer. The first interconnecting finger is electrically connected to the second interconnecting finger by the bonding wire. The electrical connecting components electrically connect the chip to the substrate, and at least a portion of the bonding wire is encapsulated in the die-attaching layer. Moreover, a chip carrier composed of the substrate, the die-attaching layer, and the bonding wires mentioned above is also disclosed.

BRIEF DESCRIPTION OF THE DRAWINGS

The objectives and advantages of the present invention will become apparent upon reference to the following description and the accompanying drawings in which.

DETAILED DESCRIPTION OF THE INVENTION

Please refer to the attached drawings, which illustrate the present invention described by means of embodiment(s) below.

Figure 1:
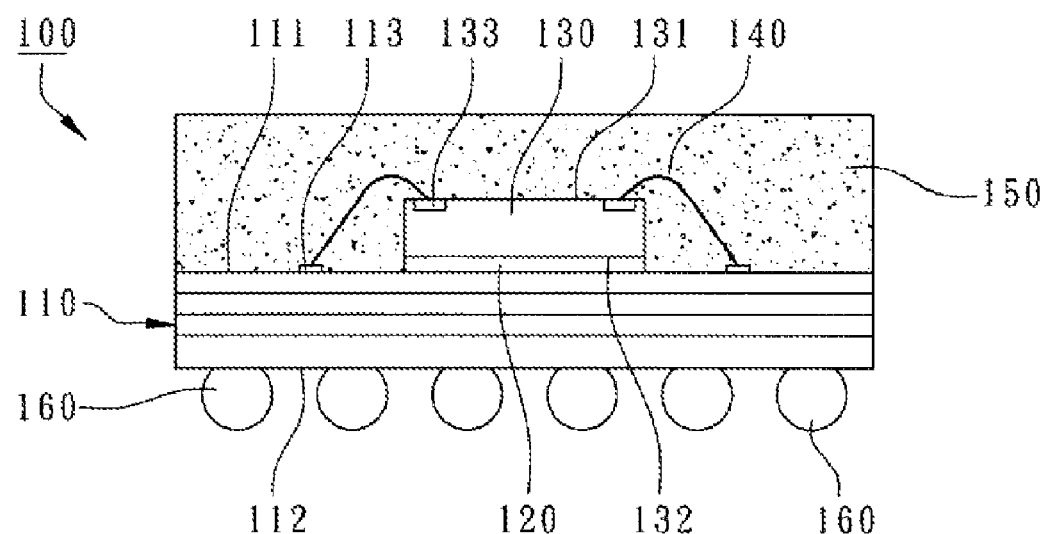
FIG. 1 shows a cross-sectional view of a conventional IC package.
Figure 2:
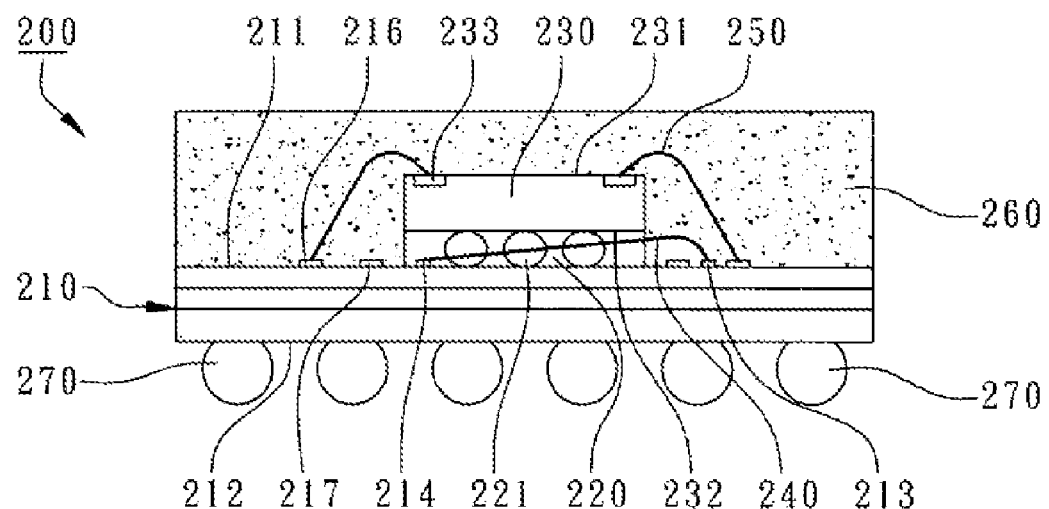
FIG. 2 shows a cross-sectional view of an IC package according to a first embodiment of the present invention.
Figure 3:
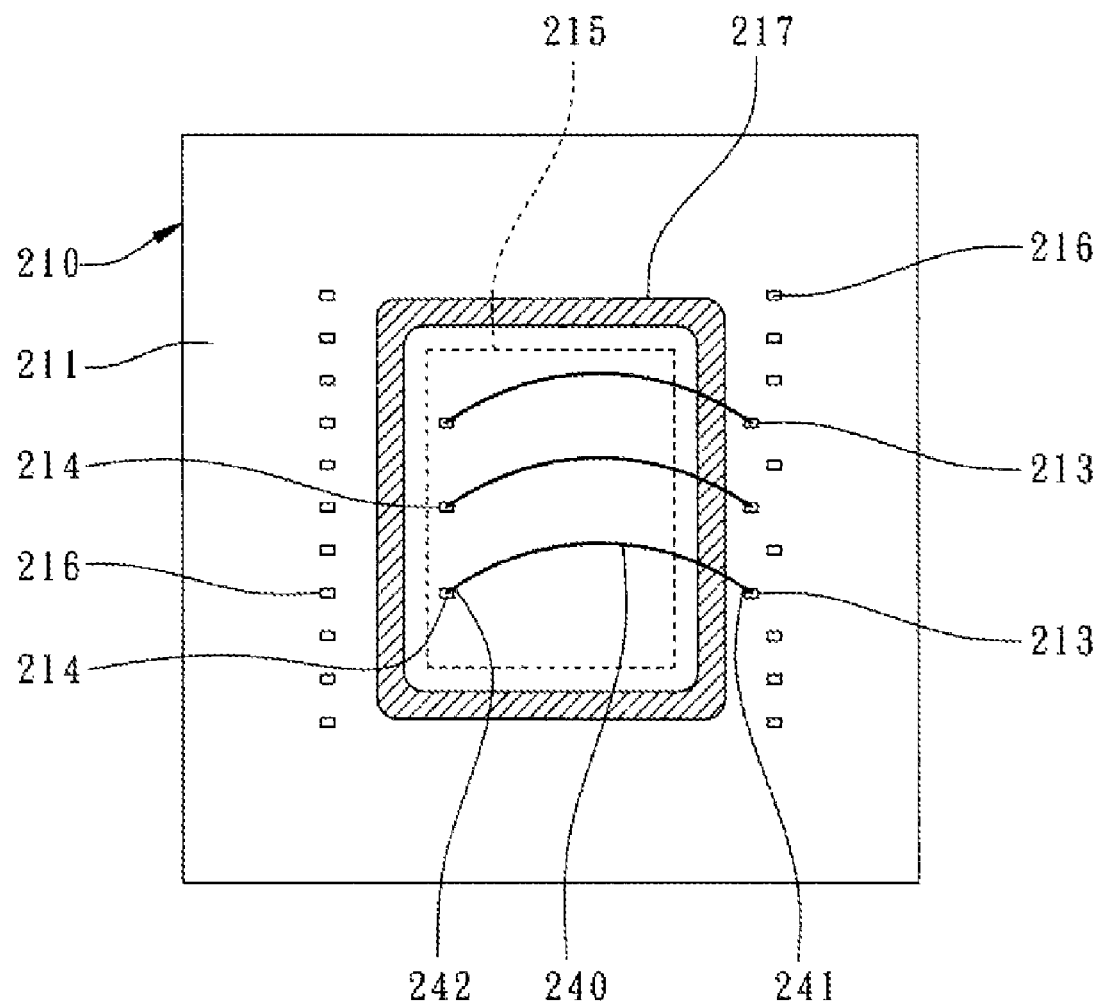
FIG. 3 shows a top view of a substrate of the IC package before die attachment according to a first embodiment of the present invention.

According to a first embodiment of the present invention, as shown in FIG. 2, an IC package 200 primarily comprises a substrate 210, a die-attaching layer 220, a chip 230, at least a bonding wire 240, and a plurality of electrical connecting components 250. The substrate 210 has a top surface 211 and a bottom surface 212. The at least one first interconnecting finger 213, at least one second interconnecting finger 214, and a plurality of inner fingers 216 are disposed on the top surface 211. Moreover, the top surface 211 includes a die-attaching area 215 wherein the die-attaching layer 220 is disposed on the die-attaching area 215. As shown in FIG. 3, in this embodiment, the first interconnecting finger 213 and a plurality of inner fingers 216 are disposed outside the die-attaching area 215, and the second interconnecting finger 214 is disposed inside the die-attaching area 215. The bonding wire 240 is formed by wire-bonding technology and has a ball bond 241 and a wedge bond 242, wherein the ball bond 241 is bonded to the first interconnecting finger 213 and the wedge bond 242 is bonded to the second interconnecting finger 214 so that the maximum loop peak of the bonding wire 240 is located outside the die-attaching area 215. The substrate 210 further has a ground ring 217 formed between the first interconnecting fingers 213 and the second interconnecting fingers 214 on the top surface 211, wherein the ground ring 217 encircles the die-attaching area 215. The bonding wire 240 overpassing the ground ring 217 electrically connects the first interconnecting finger 213 to the second interconnecting finger 214 so that the bonding wire 240 can serve as internal electrical connections for the substrate 210. In the present embodiment, the substrate 210 can be a multi-layer printed circuit board, and some wiring traces or/and vias can be replaced by the bonding wire 240.

The die-attaching layer 220 is formed on the die-attaching area 215 on the top surface 211 of the substrate 210. The die-attaching layer 220 may be selected from the group consisting of resin containing spacer balls with equal diameters, B-stage resin, adhesive film, epoxy, non-conductive paste or liquid paste to bond the chip 230. Preferably, the die-attaching layer 220 is formed by a resin containing spacer balls with equal diameters to keep a constant gap between the chip 230 and the substrate 210, and to ensure that the back surface 232 of the chip 230 does not directly contact the bonding wire 240.

As shown in FIG. 2, the chip 230 has an active surface 231 and a corresponding back surface 232 wherein a plurality of bonding pads 233 are formed on the active surface 231, and the back surface 232 of the chip 230 is attached to the top surface 211 of the substrate 210 by the die-attaching layer 220. In addition, the chip 230 is aligned with the die-attaching area 215.

The first interconnecting finger 213 is electrically connected to the second interconnecting finger 214 by the bonding wire 240 wherein the first interconnecting finger 213 is located outside the die-attaching area 215 and the second interconnecting finger 214 is located inside the die-attaching area 215. The bonding wire 240 has a ball bond 241 and a wedge bond 242 wherein the ball bond 241 is bonded to the first interconnecting finger 213 and the wedge bond 242 is bonded to the second interconnecting finger 214. Accordingly, a portion of the bonding wire 240 is encapsulated in the die-attaching layer 220. In the present embodiment, the bonding wire 240 with reduced loop peak does not touch the back surface 232 of the chip 230.

The bonding pads 233 of the chip 230 are electrically connected to the inner fingers 216 of the substrate 210 by the electrical connecting components 250. In the present embodiment, the electrical connecting components 250 are a plurality of bonding wires formed by a wire-bonding process.

The IC package 200 further comprises an encapsulant 260 formed on the top surface 211 of the substrate 210 to encapsulate the chip 230 and the electrical connecting components 250. In the present embodiment, the encapsulant 260 further encapsulates the portion of the bonding wires 240 extending outside the die-attaching layer 220. More specifically, the IC package 200 further comprises a plurality of external terminals 270 which are disposed on the bottom surface 212 of the substrate 210 for external electrical connections. The external terminals 270 may be solder balls, solder paste, contact pads, or contact pins. In the present embodiment, the external terminals 270 are solder balls and the IC package 200 is a Ball Grid Array Package (BGA).

Therefore, the bonding wires 240 formed by conventional wire bonders can replace parts of the wiring layers and vias inside a conventional substrate. Since the substrate 210 does not have a complete electrical transmission infrastructure, the wiring layers can be reduced, and the substrate cost and thickness can also be reduced. Furthermore, a chip carrier composed of the substrate 210, the die-attaching layers 220, and bonding wires 240 is also proposed. In a different embodiment, the die-attaching layer 220 is a B-stage paste which is non-adhesive at room temperature for easy shipping and handling.

Figure 4:
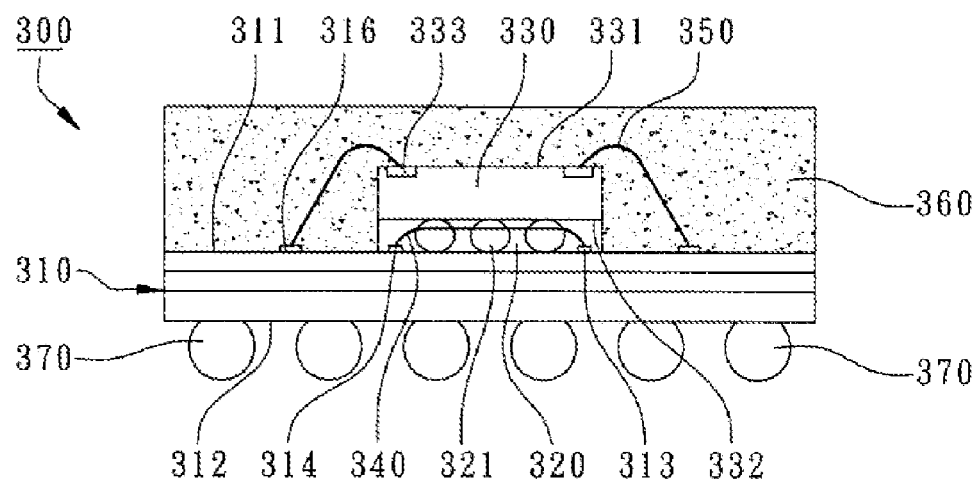
FIG. 4 shows a cross-sectional view of an IC package according to a second embodiment of the present invention.
Figure 5:
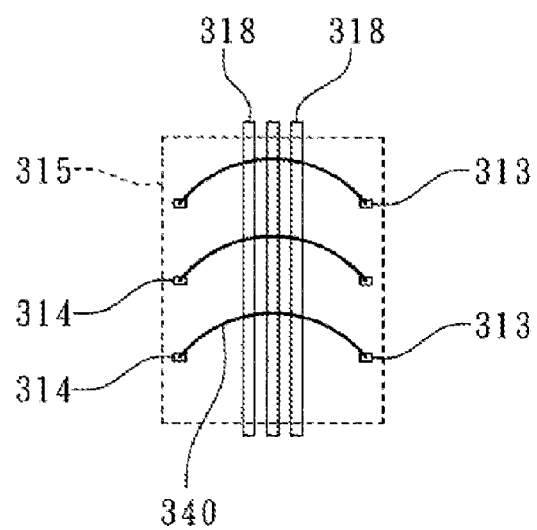
FIG. 5 shows a partial top view of a substrate of the IC package before die attachment according to a second embodiment of the present invention.

Another IC package is revealed in a second embodiment of the present invention, as shown in FIG. 4. An IC package 300 primarily comprises a substrate 310, a die-attaching layer 320, a chip 330, at least a bonding wire 340, and a plurality of electrical connecting components 350. The substrate 310 has a top surface 311 and a bottom surface 312 and further has at least a first interconnecting finger 313 and at least a second interconnecting finger 314 which are disposed on the top surface 311. Moreover, a die-attaching area 315 is defined on the top surface 311 for the disposition of the die-attaching layer 320. As shown in FIG. 5, in the present embodiment, the first interconnecting finger 313 and the second interconnecting finger 314 are located inside the die-attaching area 315 to effectively utilize the no-wiring area of the substrate 310. The substrate 310 further has at least one trace 318 formed on the top surface 311 between the first interconnecting finger 313 and the second interconnecting finger 314.

The die-attaching layer 320 is formed on the die-attaching area 315 on the top surface 311 of the substrate 310. The die-attaching layer 320 comprises resin containing a plurality of spacer balls 321 with equal diameters. The back surface 332 of the chip 330 is attached to the top surface 311 of the substrate 310 by the die-attaching layer 320. In the present embodiment, the chip 330 has a plurality of bonding pads 333 formed on the active surface 331 of the chip 330.

As shown in FIG. 4, the first interconnecting finger 313 is electrically connected to the second interconnecting finger 314 by the bonding wires 340 overpassing the trace 318. In addition, the bonding wire 340 is completely encapsulated by the die-attaching layer 320. The bonding pads 333 of the chip 330 are electrically connected to the inner fingers 316 of the substrate 310 by the electrical connecting components 350.

The IC package 300 further comprises an encapsulant 360 formed on the top surface 311 of the substrate 310 to encapsulate the chip 330 and the electrical connecting components 350. A plurality of external terminals 370 such as solder balls are disposed on the bottom surface 312 of the substrate 310 for external electrical connections.

Therefore, both ends of the bonding wires 340 are bonded on the substrate 310 to replace parts of the wiring traces or/and vias of a conventional substrate. During the packaging processes, the substrate 310 can be manufactured to have a complete electrical connection infrastructure so that the wiring layers of the substrate 310 can be reduced and simplified to reduce the substrate cost.

Figure 6:
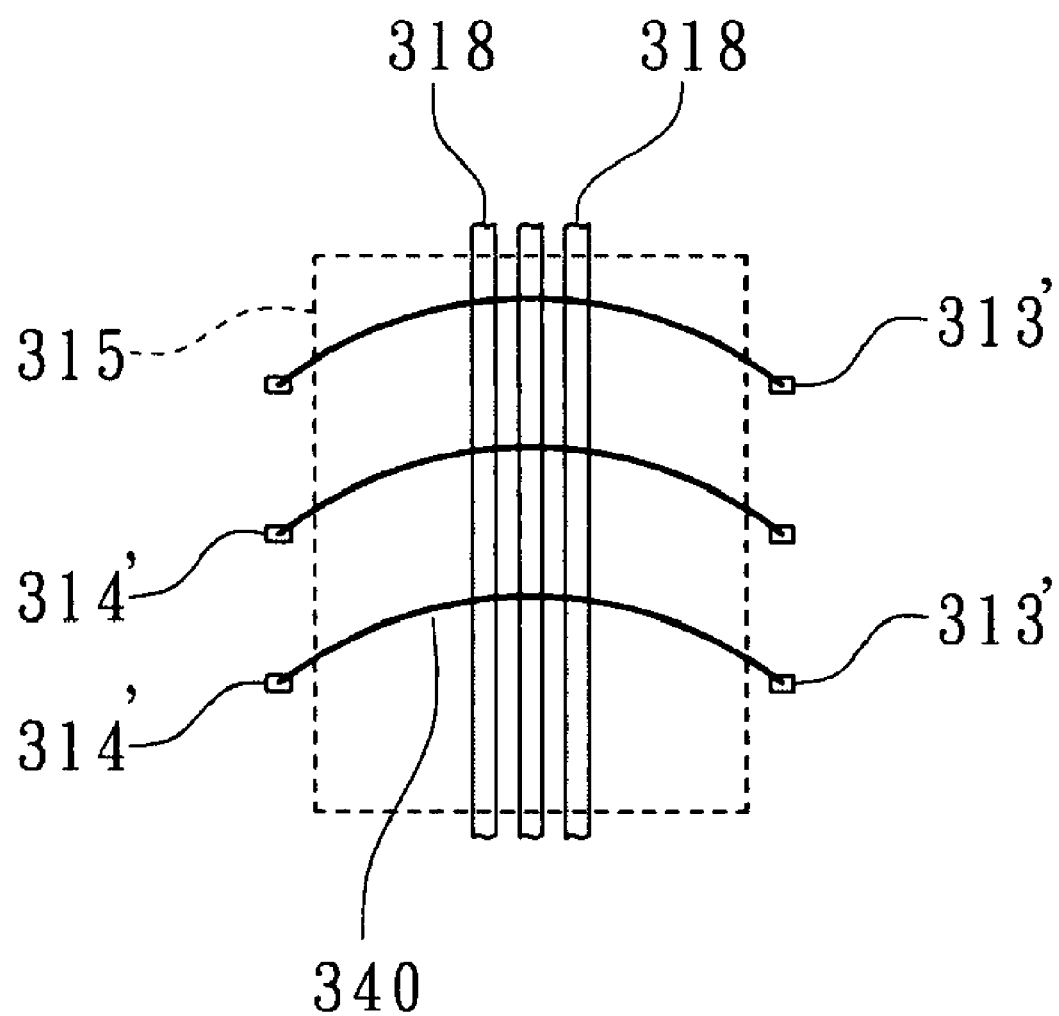
FIG. 6 shows a partial top view of another substrate of the IC package before die attachment according to a third embodiment of the present invention.

In the third embodiment, another IC package is revealed in FIG. 6 where the major components in the third embodiment are almost the same as those in the second embodiment, therefore, the figure labels will follow those of the second embodiment. At least one first interconnecting finger 313' and at least one second interconnecting finger 314' are disposed on the top surface 311 of the substrate 310. A die-attaching area 315' is defined on the top surface 311 of the substrate 310 for die attachment. In the present embodiment, the first interconnecting finger 313' and the second interconnecting finger 314' are located outside the die-attaching area 315. At least one trace 318 is disposed between the first interconnecting finger 313' and the second interconnecting finger 314' on the substrate 310. At least one bonding wire 340 connecting the first interconnecting finger 313' and the second interconnecting finger 314' is formed following a shortest electrical path across the die-attaching area 315.

The above description of embodiments of this invention is intended to be illustrative and not limiting. Other embodiments of this invention will be obvious to those skilled in the art in view of the above disclosure.

What is claimed is:

1. An IC package comprising:
   a substrate having a top surface, a bottom surface, a first interconnecting finger and a second interconnecting finger disposed on the top surface, wherein the top surface includes a die-attaching area;

a die-attaching layer formed on the die-attaching area on the top surface of the substrate; a chip disposed on the top surface of the substrate and attached to the die-attaching area by the die-attaching layer;

at least one bonding wire connecting the first interconnecting finger to the second interconnecting finger;

a plurality of electrical connecting components electrically connecting the chip to the substrate;

wherein at least a portion of the bonding wire is encapsulated in the die-attaching layer;

wherein the first interconnecting finger and the second interconnecting finger are located outside the die-attaching area;

wherein the die-attaching layer is comprised of a resin containing spacer balls.

2. The IC package of claim 1, wherein a middle portion of the bonding wire is partially encapsulated by the die-attaching layer.

3. The IC package of claim 1, wherein the bonding wire is formed following a shortest electrical path across the die-attaching area.

4. The IC package of claim 1, wherein the substrate further has at least one trace extending between the first interconnecting finger and the second interconnecting finger on the top surface of the substrate.

5. The IC package of claim 1, further comprising an encapsulant formed on the top surface of the substrate to encapsulate the chip, the electrical connecting components, and a portion of the bonding wire extending outside the die-attaching layer.

6. The IC package of claim 1, wherein the spacer balls have an equal diameter.

7. The IC package of claim 1, further comprising a plurality of external terminals disposed on the bottom surface of the substrate.

8. The IC package of claim 1, wherein the electrical connecting components are a plurality of bonding wires formed by a wire-bonding process.

9. A chip carrier of an IC package comprising:

a substrate having a top surface, a bottom surface, a first interconnecting finger and a second interconnecting finger disposed on the top surface, wherein the top surface includes a die-attaching area;

a die-attaching layer formed on the die-attaching area on the top surface of the substrate; and at least one bonding wire connecting the first interconnecting finger and the second interconnecting finger;

wherein at least a portion of the bonding wire is encapsulated in the die-attaching layer;

wherein the first interconnecting finger and the second interconnecting finger are located outside the die-attaching area;

wherein the die-attaching layer is comprised of a resin containing spacer balls.

10. The chip carrier of claim 9, wherein a middle portion of the bonding wire is encapsulated by the die-attaching layer.

11. The chip carrier of claim 9, wherein the bonding wire is formed following a shortest electrical path across the die-attaching area.

12. The chip carrier of claim 9, wherein the substrate further has at least one trace extending between the first interconnecting finger and the second interconnecting finger on the top surface of the substrate.

13. The chip carrier of claim 9, wherein the spacer balls have an equal diameter.

* * * * *